(12) United States Patent
Kishimoto (10) Patent No.: US 10,991,778 B2
(45) Date of Patent: Apr. 27, 2021

(54) ORGANIC EL DISPLAY APPARATUS AND MANUFACTURING METHOD THEREFOR

(71) Applicant: SAKAI DISPLAY PRODUCTS CORPORATION, Sakai (JP)

(72) Inventor: Katsuhiko Kishimoto, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/607,329

(22) PCT Filed: Mar. 28, 2018

(86) PCT No.: PCT/JP2018/012908
§ 371 (c)(1),
(2) Date: Feb. 18, 2020

(87) PCT Pub. No.: WO2019/186807
PCT Pub. Date: Oct. 3, 2019

(65) Prior Publication Data
US 2020/0168682 A1    May 28, 2020

(51) Int. Cl.
*H01L 27/32* (2006.01)
*H01L 51/56* (2006.01)

(52) U.S. Cl.
CPC ...... *H01L 27/3258* (2013.01); *H01L 27/3276* (2013.01); *H01L 51/56* (2013.01); *H01L 2227/323* (2013.01)

(58) Field of Classification Search
CPC ... H01L 27/3258; H01L 27/3276–3279; H01L 2227/323; G09G 3/3233–3258
See application file for complete search history.

(56) References Cited

U.S. PATENT DOCUMENTS

| | | | | |
|---|---|---|---|---|
| 2001/0011868 A1* | 8/2001 | Fukunaga | ........... | H01L 51/5234 313/506 |
| 2002/0000613 A1 | 1/2002 | Ohtani et al. | | |
| 2002/0047567 A1* | 4/2002 | Fujita | .................. | H01L 27/3248 315/169.3 |

(Continued)

FOREIGN PATENT DOCUMENTS

| | | |
|---|---|---|
| JP | H11-163364 A | 6/1999 |
| JP | 2001-291595 A | 10/2001 |

(Continued)

*Primary Examiner* — Shaun M Campbell
(74) *Attorney, Agent, or Firm* — ScienBiziP, P.C.

(57) ABSTRACT

The present invention is equipped with: a substrate (10) that has a surface upon which a drive circuit containing a TFT (20) is formed; a planarization film (30) that makes the surface of the substrate planar by covering the drive circuit; and an organic light-emitting element (40) that is provided with a first electrode (41) formed upon the surface of the planarization film and connected to the drive circuit, an organic light-emitting layer (43) formed upon the first electrode, and a second electrode (44) formed upon the organic light-emitting layer. In addition, the planarization film has a two-layer structure comprising an inorganic insulating film (31) and an organic insulating film (32) that are layered upon the TFT, a conductor layer containing a titanium layer and a copper layer is embedded in the interior of a contact hole, and the first electrode is formed electrically connected to the conductor layer.

8 Claims, 8 Drawing Sheets

(56) References Cited

U.S. PATENT DOCUMENTS

| | | | |
|---|---|---|---|
| 2005/0116620 A1* | 6/2005 | Kobayashi | H01L 51/5271 |
| | | | 313/503 |
| 2008/0230767 A1 | 9/2008 | Jung et al. | |
| 2009/0075438 A1* | 3/2009 | Jo | H01L 27/3258 |
| | | | 438/155 |
| 2009/0134392 A1 | 5/2009 | Jeong | |
| 2012/0161118 A1 | 6/2012 | Jung et al. | |
| 2016/0104734 A1 | 4/2016 | Hirose et al. | |
| 2017/0125450 A1 | 5/2017 | Hodo et al. | |
| 2018/0097053 A1* | 4/2018 | Park | H01L 27/3248 |
| 2018/0138213 A1 | 5/2018 | Hodo et al. | |
| 2019/0189643 A1 | 6/2019 | Hodo et al. | |

FOREIGN PATENT DOCUMENTS

| | | |
|---|---|---|
| JP | 2008-233844 A | 10/2008 |
| JP | 2010-139920 A | 6/2010 |
| JP | 2016-197704 A | 11/2016 |
| JP | 2017-011173 A | 1/2017 |
| JP | 2017-085099 A | 5/2017 |
| KR | 2003-0057632 A | 7/2003 |

\* cited by examiner

ORGANIC EL DISPLAY APPARATUS AND MANUFACTURING METHOD THEREFOR

TECHNICAL FIELD

The present invention relates to an organic EL display apparatus and a manufacturing method thereof.

BACKGROUND ART

In recent years, there has been a tendency for organic EL display apparatuses to be adopted in large-sized televisions and mobile devices. An organic EL display apparatus is configured with a drive circuit being formed in a region of each pixel, the drive circuit using a thin film transistor (also called TFT below) as active elements such as a switching element and a drive element, and an organic light emitting element of each pixel being formed thereon so as to be connected to the TFT. The types of organic EL display apparatuses comprise a top emission type with the top surface of a light emitting element as a display surface and a bottom emission type with the rear surface of an insulating substrate as a display surface. With the top emission type, regardless of a display region of the organic light emitting element, the previously described drive circuit is formed at a lower portion of the display region. On the other hand, with the bottom emission type, the drive circuit is formed at the peripheral edge of the display region. Therefore, with a small-sized organic EL display apparatus such as a mobile device in which space forming the drive circuit is small, the top emission type, or a configuration in which the drive circuit such as the TFT is formed at a lower portion of the almost entire surface of display region, is frequently used. On the other hand, the bottom emission type is suitable for a large-sized television with some room for space between pixels.

When the drive circuit including TFT is formed, the surface thereof becomes uneven. As the organic light emitting element is formed thereon, a planarizing layer is formed by covering over the drive circuit with a resin material. In this way, the surface is planarized. In the prior art, this planarizing layer is obtained by, forming an inorganic insulating layer to be a barrier layer after the TFT is formed, and forming a contact hole for connecting the previously described organic light emitting element and the TFT by a photolithography process, and forming a photosensitive organic insulating layer on the inorganic insulating layer being formed with the contact hole, and forming a contact hole by photolithography process and wet development. In this way, the organic insulating layer is formed to planarize unevenness of the surface due to forming of the TFT.

Patent document 1 discloses a TFT and a manufacturing method thereof to achieve both a small occupation area and excellent transistor characteristics, the TFT and the manufacturing method being suitable for a switching element for each pixel of an active matrix type display apparatus. Therein, multi-layer TFTs are integrally formed vertically by forming TFTs having the same configuration via an interlayer insulating layer whose surface unevenness is made to be no more than 20 nm by a CMP process. In other words, in forming multi-layer fine TFTs, the planarity of the surface of the interlayer insulating layer between the multi-layer TFTs requires to be made in no more than 20 nm to deal with a small depth of focus. Therefore, this planarizing is different from an intent to planarize an organic insulating layer which is an under layer for an organic light emitting device over the TFT.

PRIOR ART DOCUMENT

Patent Document

Patent Document 1: JP 2017-011173A

SUMMARY OF THE INVENTION

Problem to be Solved by the Invention

On the other hand, in a case of visually recognizing an organic EL display apparatus, depending on a pixel, chromaticity unevenness or luminance unevenness can occur to cause the visual recognition characteristics to be reduced. As a result of repeatedly making a diligent study on a cause by which chromaticity unevenness or luminance unevenness occurs, the present inventor has found that it is caused by a case of insufficient electric connection between a first electrode of an organic light emitting element and a drive circuit in which contact (connection) resistance increases, causing current to not flow sufficiently, and by a case of the lack of planarity of the surface of the organic light emitting layer.

There is a problem that display definition decreases when display unevenness caused by luminance unevenness and/or chromaticity unevenness as described previously occurs, even in a case that there is no obvious display defect such as a non-lighted region, an always-lighted region, or a bright line in a display screen of a display apparatus.

Moreover, in a conventional organic light emitting element, it is practiced to increase a light emitting output by making a microcavity by providing a layer with a large reflectance on a surface of the organic light emitting layer. In this case, when the previously described planarity reduction occurs, there occurs unevenness on the surface of the organic light emitting layer, and thereby, unevenness is formed even on the reflective layer, so that a light from the organic light emitting layer reflects irregularly, and it is not possible to effect a complete resonator. Therefore, there is a problem that, it is not possible to obtain an increase in output.

On the other hand, in the present invention, as it is not an object to manufacture a multi-layer fine TFT, it is not required to form a strict surface planarity at no more than 20 nm as disclosed in the previously described Patent document 1. It suffices to have such a planarity degree that light emitted from the organic light emitting layer enters substantially to the front surface of the display with a peak in about the center.

An object of the present invention being made in view of such circumstances as described above is to provide an organic EL display apparatus and a manufacturing method thereof in which chromaticity unevenness and/or luminance unevenness of an organic EL display apparatus is suppressed to improve display definition.

Means to Solve the Problem

An organic EL display apparatus according to one embodiment of the present invention comprises:
a substrate having a surface on which a drive circuit comprising a thin film transistor is formed;
a planarizing layer to cover the drive circuit to planarize the surface of the substrate; and an organic light emitting element having a first electrode, the first electrode being formed on a surface of the planarizing layer and connected to the drive circuit, an organic light emitting layer, the organic light emitting layer being formed on the first electrode, and a second electrode, the second electrode being formed on the organic light emitting layer, wherein the planarizing layer comprises a two-layer structure comprising an inorganic insulating layer and an organic insulating layer, and wherein a conductor layer comprising a titanium layer and a copper layer is embedded at an interior of a contact hole, and the first electrode is formed so as to electrically connect to the conductor layer.

A method of manufacturing an organic EL display apparatus according to another embodiment of the present invention comprises:

forming, on a substrate, a drive circuit comprising a thin film transistor;

forming, on a surface of the drive circuit, a planarizing layer comprising an inorganic insulating layer and an organic insulating layer, and then forming, at the planarizing layer, a contact hole exposing a part of the thin film transistor;

forming, on an inner surface of the contact hole and a surface of the organic insulating layer, a conductor layer comprising a titanium layer and a copper layer;

removing the conductor layer from the surface of the organic insulating layer by polishment, and then planarizing the surface, exposed by removing the conductor layer, of the organic insulating layer by chemical mechanical polishing (CMP);

forming, on a surface polished by CMP of the organic insulating layer, a first electrode so as to be connected to the conductor layer formed at an interior of the contact hole;

forming an organic light emitting layer on the first electrode; and forming a second electrode on the organic light emitting layer.

Effects of the Invention

According to embodiments of the present invention, it is ensured that the electrical connection be made between the drive circuit and the organic light emitting element regardless of the pixel, and also the electrical connection is made at a low resistance, so that each pixel emits light uniformly at a high luminance. Moreover, the surface of the planarizing layer is planarized to form the first electrode of the organic light emitting element on the surface thereof by sputtering or the like, so that the surface of the organic light emitting layer is also planar and there is no inclined surface due to unevenness of the light emitting surface even when viewed microscopically, so that light at the center of light emission is emitted toward the display screen. Therefore, luminance unevenness and/or chromaticity unevenness is suppressed, making it possible to substantially increase the display definition of the organic EL display apparatus.

EMBODIMENT FOR CARRYING OUT THE INVENTION

Figure 1:
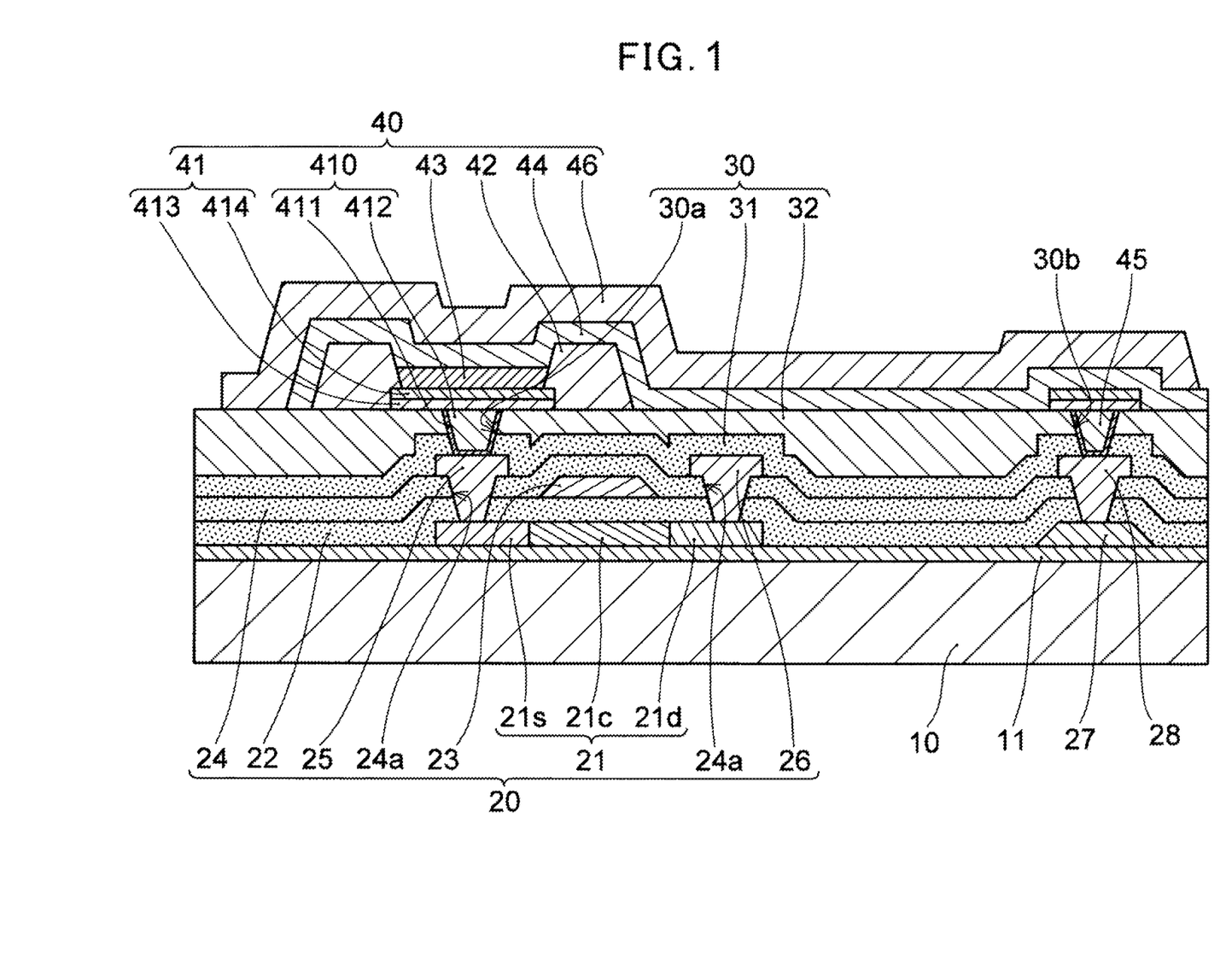
FIG. 1 shows a cross-sectional view of an organic EL display apparatus according to one embodiment of the present invention.

An organic EL display apparatus being one embodiment of the present invention will be described below with reference to the drawings. FIG. 1 schematically shows a cross-sectional view of what corresponds to one pixel (while it, more strictly, refers to sub-pixels of red, green, and blue in one pixel), the present specification can also include these sub-pixels to refer thereto.

An organic EL display apparatus according to one embodiment of the present invention, as shown in FIG. 1 showing an explanatory view of a cross section thereof, comprises a substrate 10 having a surface on which a drive circuit comprising a thin film transistor (TFT) 20 is formed; a planarizing layer 30 to cover the drive circuit to planarize the surface of the substrate 10; and an organic light emitting element 40 having a first electrode 41, the first electrode 41 being formed on the surface of the planarizing layer 30 and connected to the drive circuit, an organic light emitting layer 43, the organic light emitting layer 43 being formed on the first electrode 41, and a second electrode 44, the second electrode 44 being formed on the organic light emitting layer 43. Then, the planarizing layer 30 comprises a two-layer structure comprising an inorganic insulating layer 31 and an organic insulating layer 32, the inorganic insulating layer 31 and the organic insulating layer 32 being deposited on the TFT 20, and has a conductor layer 410 being embedded at the interior of a contact hole 30a, the conductor layer 410 comprising a titanium layer 411 (below also called Ti) and a copper layer 412 (below also called Cu), the first electrode 41 being formed in electrical connection to the conductor layer 410.

In other words, the organic EL display apparatus according to the present embodiment is characterized in that the conductor layer 410 being embedded at the interior of the contact hole 30a to connect to a source electrode 25 of the TFT 20 is formed of the Ti layer 411, and the Cu layer 412 being formed by electroplating with the Ti layer 411 thereof as a conducting layer, and that the first electrode 41 of the organic light emitting element 40 is formed by being connected to the conductor layer 410 thereof. The Ti layer is formed by sputtering, for example, so that, even with some stepped portions or unevenness, it adheres to the inner surface of the contact hole 30a. Therefore, when electroplating is applied, passing current to the Ti layer 411 thereof causes copper to be precipitated on the entirety of the surface thereof. As a result, even with a small contact hole, copper is precipitated also on the entirety of the surface thereof and at the entire interior of the contact hole 30a, causing the interior of the contact hole 30a to be embedded with copper. As a result, even when there are stepped portions in the contact hole 30a or even when a metal layer is formed at the interior of the contact hole 30a to cause the contact hole 30a to be smaller, copper is embedded on the entire surface of the interior thereof without any gaps. Even more, copper has a small electric resistance, so that the TFT 20 and the first electrode 41 are to be connected via the conductor layer 410 being very good in conductivity.

As described previously, as a result of repeatedly making a diligent study on a cause by which chromaticity unevenness and/or luminance unevenness of the organic EL display apparatus occurs, the present inventor has found that it is caused by a case occurring in which the conductor layer 410 at the interior of the contact hole 30a connecting the TFT 20 of the drive circuit and the first electrode 41 of the organic light emitting element 40 is not formed at a low resistance, the conductor layer 410 and the first electrode 41 are not connected at a low resistance, and, moreover, there is unevenness on the surface of the organic light emitting layer 43, so that, microscopically, the surface of the organic light emitting layer 43 is inclined to be not completely planar, so that it is partly inclined when viewed microscopically, and, where it is inclined, the normal direction of the surface of the organic light emitting layer 43 is inclined relative to the normal direction of the display surface. In other words, a resistance at the connecting portion causes a loss of current to reduce luminance and a surface being inclined toward a light emitting surface, when visually recognized from a direction perpendicular to the display surface, causes recognition of light of a pixel for which an emitted light travels in an oblique direction to be difficult, causing a reduction in luminance or a change in colors of mixed colors. In other words, light emitted having maximum luminance in the normal direction thereof will have luminance thereof decreasing as it is inclined relative to the normal direction. With a small-sized display apparatus such as a smartphone, the size of this sub-pixel is very small with one side of a few tens of μm. Therefore, even with slight unevenness, light emitted toward the front becomes very weak for a sub-pixel having unevenness on the surface of the organic light emitting layer 43.

In the prior art, as a countermeasure for such chromaticity unevenness and/or luminance unevenness, with a TFT for compensation being built in the display region and/or at the outer edge of the display panel, luminance of a pixel with chromaticity unevenness and/or luminance unevenness is adjusted using a circuit in an inspection after development into a product. Therefore, there is also a problem that the drive circuit increases in complexity.

Describing in more detail, the TFT 20 and the first electrode 41 in the prior art are connected by embedding, using sputtering or vacuum deposition, an ITO layer and silver (also called Ag below) at the interior of a contact hole formed at a planarizing layer. However, the diameter of this contact hole is small at around 5 μm, for example. Even more, with the planarizing layer being formed with at least a two-layer structure comprising an inorganic insulating layer and an organic insulating layer, even when the two layers are etched simultaneously, the etching rate differs between the inorganic insulating layer and the organic insulating layer, so that a stepped portion or an undercut portion is likely to be created at the interface thereof. Even when a photosensitive resin is used for the organic insulating layer to separately form the contact hole of the inorganic insulating layer and the contact hole of the organic insulating layer, it is difficult for the contact hole patterns to match completely, so that a stepped portion is likely to be created. When this contact hole is embedded with ITO, and Ag or APC by sputtering or vacuum deposition, it becomes more difficult for a metal to enter into the interior of the contact hole as the hole becomes smaller. The present inventor has found that, as a result, the number of air gaps can increase, and electric resistance between the source electrode of the TFT and the first electrode of the organic light emitting element can increase. The present inventor has found that luminance of such a pixel with an increased electric resistance decreases, causing luminance unevenness.

Moreover, as described previously, the organic light emitting element is formed on a planarizing layer to planarize the surface, the planarizing layer being formed on a TFT with which a drive circuit is formed. The surface of the above-mentioned organic insulating layer is more or less planar, which is considered in the prior art to be not problematic. However, as a result of repeatedly making a diligent study thereon, the present inventor has found that, even when a non-photosensitive resin is used, the surface of the organic insulating layer has the arithmetic average roughness Ra of approximately 100 to 300 nm, and, with the photosensitive resin conventionally used in general, further unevenness occurs relative to the non-photosensitive resin, so that, when the organic light emitting layer and an electrode of the organic light emitting element are formed on the above-mentioned surface, the surface of the organic light emitting layer also has the surface roughness of the same magnitude. When unevenness occurs on the surface of the organic light emitting layer, the orientation in which light travels as viewed microscopically varies. Therefore, it is found that, when the display screen is viewed from the front, it becomes more difficult to visually recognize light travelling in an oblique direction, causing chromaticity unevenness and/or luminance unevenness to occur.

Thus, the present inventor has found that the conductor layer 410 to be embedded at the interior of the contact hole 30a can be formed with the Ti layer 411 formed by sputtering and the Cu layer 412 formed using electroplating with this Ti layer 411 as a seed layer to completely embed a conductor at the interior of the contact hole 30a and at a low resistance. In other words, even when the Ti layer 411 is formed at the interior of the contact hole 30a using sputtering, being at an initial phase in which a metal layer is formed at the interior of the contact hole 30a, the contact hole 30a is also uniformly formed in a large size, and, thereafter, being a Cu layer using electroplating, even when the contact hole 30a becomes smaller, a plating solution tends to soak thereinto, and the Cu layer 412 is also uniformly formed on the entire surface thereof. The Ti layer 411 has a function of preventing Cu from entering into the TFT 20.

This Ti layer 411 is formed by sputtering, so that it is formed not only at the interior of the contact hole 30a, but also on the organic insulating layer 32. Therefore, the conductor layer 410 formed on the surface of the organic insulating layer 32 needs to be removed. However, the Cu layer 412 being chemically stable is difficult to be etched. On the other hand, as described previously, the present inventor has found that planarity of the surface of this organic insulating layer 32 is also a cause for display unevenness such as luminance unevenness. Therefore, the copper layer 412 formed on this organic insulating layer 32 is removed by polishment and, moreover, the organic insulating layer 32 being exposed is also polished by polishing of the copper layer 412 and the Ti layer 411. At that time, as described previously, the surface having fine unevenness can be polished to the surface roughness of no more than 50 nm in arithmetic average roughness Ra to suppress chromaticity unevenness and/or luminance unevenness due to the previously described surface roughness. In other words, the present embodiment is characterized in that a metal to be embedded at the interior of the contract hole 30a is formed with the Ti layer 411 and the copper layer 412 and that, more preferably, the surface of the planarizing layer 30 is polished and formed to the arithmetic average roughness Ra of no more than 50 nm.

It has been found that, while smaller the surface roughness the more preferable, as shown in the previously-mentioned Patent document 1, it is not necessarily to provide planarity of 20 nm or below, so that, even when the arithmetic average roughness Ra is no less than 20 nm, almost no chromaticity unevenness or luminance unevenness occurs as long as the connection resistance is sufficiently small in a stable manner. In other words, as no lower limit is set since smaller the surface roughness the more preferable, however polishing tasks become cumbersome to reduce the surface roughness, so that it is preferable to have a surface roughness of 20 nm or more and 50 nm or less.

(Structure of Organic EL Display Apparatus)

The organic EL display apparatus shown in FIG. 1 is specifically described below.

In a case of a bottom emission type in which a display image is visually recognized with a substrate surface as a display surface, the substrate 10 needs to transmit light emitted by the organic light emitting layer 43, so that an insulating substrate of a light transmitting material is used. More specifically, a glass substrate or a resin film such as polyimide is used. The resin film can be used to make the organic EL display apparatus flexible, also making it possible to bond it onto a curved surface.

While not required in a case that the substrate 10 is a glass substrate, a basecoat layer 11 is formed in a case that the substrate 10 is a resin film such as polyimide since the surface is not crystalline and is prone to react with a semiconductor layer. As the basecoat layer 11, a deposited body is formed with $SiO_2$ having the thickness of approximately 500 nm, $SiN_x$ having the thickness of approximately 50 nm, and $SiO_2$ having the thickness of approximately 250 nm, using a plasma CVD, for example.

A drive circuit comprising the TFT 20 is formed on the basecoat layer 11. While only a cathode line 27 is shown in FIG. 1, other gate and signal lines are also formed in a similar manner. Then, the TFT 20 is formed on the basecoat layer 11. While only the TFT 20 to drive the light emitting element 40 is shown in FIG. 1, other TFTs such as other switching TFTs are also formed in a similar manner. In a case of the organic EL display apparatus being the top emission type with a surface opposite to the substrate 10 as a display surface, this drive circuit can be formed over the entire surface lower to the light emitting region of the light emitting element 40. However, in a case of the bottom emission type with a surface facing the substrate 10 as a display surface, the TFT cannot be formed lower to the light emitting region of the light emitting element 40. Therefore, the TFT needs to be formed at the peripheral edge of a portion planarly overlapping the light emitting region. In this case, an inclined surface is created at a border portion between the peripheral edge at which the TFT or line is formed and the lower portion of the light emitting region at which the TFT is not formed, causing unevenness to occur at the peripheral edge of the light emitting region and display definition to deteriorate. Therefore, even with the bottom emission type, the same planarity is demanded. While capacitors are also formed at the respective pixels, they do not cause slight unevenness even when they are formed lower to the light emitting region since the area is large and the thickness is small.

The TFT 20 is formed with a semiconductor layer 21 having a source 21s, a channel 21c, and a drain 21d, as well as a gate insulating layer 22, a gate electrode 23, an interlayer insulating layer 24, a source electrode 25, and a drain electrode 26. The gate insulating layer 22 comprises $SiO_2$ with the thickness of approximately 50 nm, while the gate electrode 23 is formed by patterning after Mo with the thickness of approximately 250 nm is formed. Thereon, a drive circuit comprising the TFT 20 is formed by the interlayer insulating layer 24 comprising an $SiO_2$ layer with the thickness of approximately 300 nm and an $SiN_x$ layer with the thickness of approximately 300 nm being formed, and the source electrode 25 and the drain electrode 26 being formed so as to be connected to the source 21s and the drain 21d. Before the interlayer insulating layer 24 is formed, the cathode line 27 and the electrode connecting portion of the source 21s and the drain 21d are doped with boron and leading to increased concentration ($p^+$), and activated by annealing. More particular structures will be described in particular examples of the below described manufacturing method. While the example shown in FIG. 1 shows a top gate structure in which the gate electrode 23 is formed at a portion opposing the substrate 10 of the semiconductor layer 21, the same also applies to a bottom gate structure in which the gate electrode 23 is formed on the substrate 10.

On the surface of the drive circuit comprising this TFT 20 is formed the planarizing layer 30 comprising the inorganic insulating layer 31 comprising $SiN_x$ having the thickness of approximately 200 nm as a barrier layer and the organic insulating layer 32 comprising a polyimide or acrylic resin, having the thickness of approximately 2 μm, for example. The contact hole 30a is formed in this planarizing layer 30, the conducting layer 410 being formed at the interior of the contact hole 30a. This contact hole 30a can be formed in a collective manner with respect to the inorganic insulating layer 31 and the organic insulating layer 32, or, as described below, in the inorganic insulating layer 31, a first contact hole 30a1 can be formed, after which the organic insulating layer 32 being photosensitive can be formed and then a second contact hole 30a2 can be formed to overlap the first contact hole 30a1 by exposure and development, resulting in the contact hole 30a.

The conductor layer 410 is formed of the Ti layer 411 having the thickness of approximately 25 to 100 nm, and the Cu layer 412 having the thickness of approximately 1000 to 2000 nm. The Ti layer 411 is formed on the whole surface by sputtering or the like, so that it is formed without any gap even when there is a stepped portion at the interior of the contact hole 30a. The Cu layer is formed by electroplating the Ti layer 411 as a current supplying layer (a seed to layer). Therefore, even when there is a stepped portion at the interior of the contact hole 30a, the conductor layer 410 being of a low resistance is formed continuously. The conductor layer 410 formed on the organic insulating layer 32 is removed by polishment such as CMP, and, moreover, the surface of the organic insulating layer 32 is also polished. The above-mentioned polishing is preferably conducted to the planarity of not more than the arithmetic average roughness Ra of 50 nm.

The first electrode 41 for the organic light emitting element 40 is formed by forming an Ag layer 413 or an APC (Ag—Pd—Cu alloy) layer at the thickness of approximately 100 nm by sputtering or the like on the above-mentioned planarized surface of the planarizing layer 30, and further forming an ITO layer 414 on the surface thereof, after which the first electrode 41 is formed by patterning with a photolithography process. This first electrode 41 is not constrained to be formed on the planarizing layer 30 in which the contact hole 30a is not formed. In other words, while a concavity with a recess of the contact hole 30a is normally created in the conductor layer 410 formed on contact hole 30a, the above-mentioned concavity portion is also polished to be planar by the previously described polishing. Therefore, even when the first electrode 41 is formed on the conductor layer 410 embedded at the interior of this contact hole 30a, the planarity of the surface of the first electrode 41 maintains the planarity of the polished surface of the organic insulating layer 32. As a result, there are no problems even when this contact hole 30 is formed lower to the light emitting region of the organic light emitting element 40. Rather, on the conductor layer 410 embedded at the interior of this contact hole 30a is formed the first electrode 41 and then the organic light emitting element 40, causing advantages to be realized of a smaller electric resistance between the first electrode 41 and the conductor layer 410, an increased degree of freedom of arrangement of the TFT 20 of the drive circuit and the organic light emitting element 40 making up a pixel to increase, the pixel size and pixel pitch to be smaller, and obtaining of a very fine organic EL display apparatus having a good display definition.

This Ag or APC is very well adapted to and well bonded with Cu of the conductor layer 410. Even more, as Ag has a good light reflecting property, light emitted by the organic light emitting element 40 is reflected on a surface opposite to the substrate 10, possibly resulting in a display apparatus having large luminance as the top emission type. Moreover, the ITO formed on the surface of Ag or APC, being light transmitting and formed with a material whose work function is approximately 5 eV, improves the positive hole injectability with respect to the organic light emitting layer 43. In a case of the first electrode (anode) 41 being the bottom emission type, the ITO layer is formed with the thickness of approximately 300 nm to 1 μm. At the peripheral edge of the first electrode 41 is partitioned each pixel and formed an insulating bank 42 made of an insulating material for achieving insulation between the anode and cathode and on the first electrode 41 surrounded by the above-mentioned insulating bank 42 is deposited an organic light emitting layer 43.

The organic light emitting layer 43 is deposited on the first electrode 41 being surrounded by the above-mentioned insulating bank 42 and exposed. This organic light emitting layer 43 being shown as one layer in FIG. 1 is formed of a plurality of layer with various materials being deposited. Moreover, this organic light emitting layer 43 is susceptible to water and cannot be patterned after being formed on the whole surface, so that, using a deposition mask, an evaporated or sublimed organic material is selectively deposited only on a portion necessary. Alternatively, the organic light emitting layer 43 can be formed by printing.

Specifically, a positive hole injection layer made of a material well adapted to ionization energy being capable of improving the positive hole injectability can be provided as a layer in contact with the first electrode (anode electrode) 41, for example. On this positive hole injection layer is formed, with an amine-based material, for example, a positive hole transport layer capable of confining electrons within the light emitting layer (i.e., as an energy barrier) as well as improving stable transport of positive holes. Moreover, a light emitting layer to be selected in accordance with the light emitting wavelength is formed thereon using $Alq_3$ being doped with a red or green organic fluorescent material for red or green light emission, for example. Moreover, a DSA-based organic material is used as a blue color-based material. On the other hand, for coloring using a color filter (not shown), all of the light emitting layers can be formed with the same material without any doping. On the light emitting layer is further formed, using $Alq_3$, an electron transport layer capable of stably transporting electrons as well as improving the electron injectability. These layers, each having several tens of nm in thickness, are deposited to form deposited layers being the organic light emitting layer 43. An electron injection layer capable of improving the electron injectability, such as LiF or Liq, can also be provided between this organic light emitting layer 43 and the second electrode 44. While this is not an organic layer, it is comprised within the organic light emitting layer 43 in the present specification since it is to emit light by an organic layer.

As described previously, an organic material being a material according to each color of R, G, or B can be deposited not onto the light emitting layer of the deposited layers being the organic light emitting layer 43, but onto a color display apparatus using a color filter. In other words, the light emitting layer can be formed with the same organic material, and a color of light emitted can be specified using a color filter (not shown). Moreover, in view of emphasizing the light emitting performance, the positive hole transport layer and the electron transport layer are preferably deposited separately with a material suitable for the light emitting layer. However, taking into account the aspect of material cost, the same material common to two or three colors of R, G, and B can also be used for depositing.

After all of the deposited layers of the organic light emitting layer 43 including the electron injection layer such as an LiF layer are formed, the second electrode 44 is formed on the surface thereof. More specifically, the second electrode 44 (for example, a cathode) is formed on the organic light emitting layer 43. This second electrode (cathode) 44 is continuously formed in common over the entire pixels. This cathode 44 is connected to the cathode line 27 via the second contact 45 formed at the planarizing layer 30 and the first contact 28 formed at the insulating layer 22, 24 of the TFT 20. The second electrode 44, being formed with a light transmitting material (e.g., a thin film Mg—Ag eutectic layer), is susceptible to corrosion with moisture, so that it is encapsulated with an encapsulation layer 46 being provided on the surface thereof. The cathode material is preferably a material whose work function is small, so that an alkaline metal or an alkaline earth metal can be used. While Mg, whose work function is small at 3.6 eV, is preferable, it is active and not stable, so that it is co-deposited with approximately 10 mass % of Ag, whose work function is 4.25 eV. Al, whose work function is also small at approximately 4.25 eV, can also be used as a cathode material with LiF being used as the under layer. Therefore, with the bottom emission type, Al can be formed thickly in this second electrode 22.

The encapsulation layer (TFE: Thin Film Encapsulation) 46, comprising an inorganic insulating layer such as $SiN_x$ or $SiO_2$, for example, can be formed with one deposited layer or with at least two deposited layers. For example, it is formed with a deposited layer having the thickness of one layer of approximately from 0.1 μm to 0.5 μm, for example, and, preferably, with deposited layers of approximately two layers. This encapsulation layer 46 is preferably formed in a plurality of layers, each with different materials. Even when pin holes are created by the encapsulation layer 46 being formed with a plurality of layers, the pin holes seldom match completely in the plurality of layers, so that the encapsulation layer 46 is completely shielded from outer air. As described previously, this encapsulation layer 46 is formed so as to completely encapsulate the organic light emitting layer 43 and the second electrode 44. An organic insulating layer can further be formed at the interface of the inorganic insulating layer being two layers.

(Method of Manufacturing Organic EL Display Apparatus)

Example 1

A method of manufacturing the organic EL display apparatus shown in FIG. 1 is described with reference to flowcharts in FIGS. 2A to 2B and manufacturing processes in FIGS. 3A to 3G below.

Figure 2A:
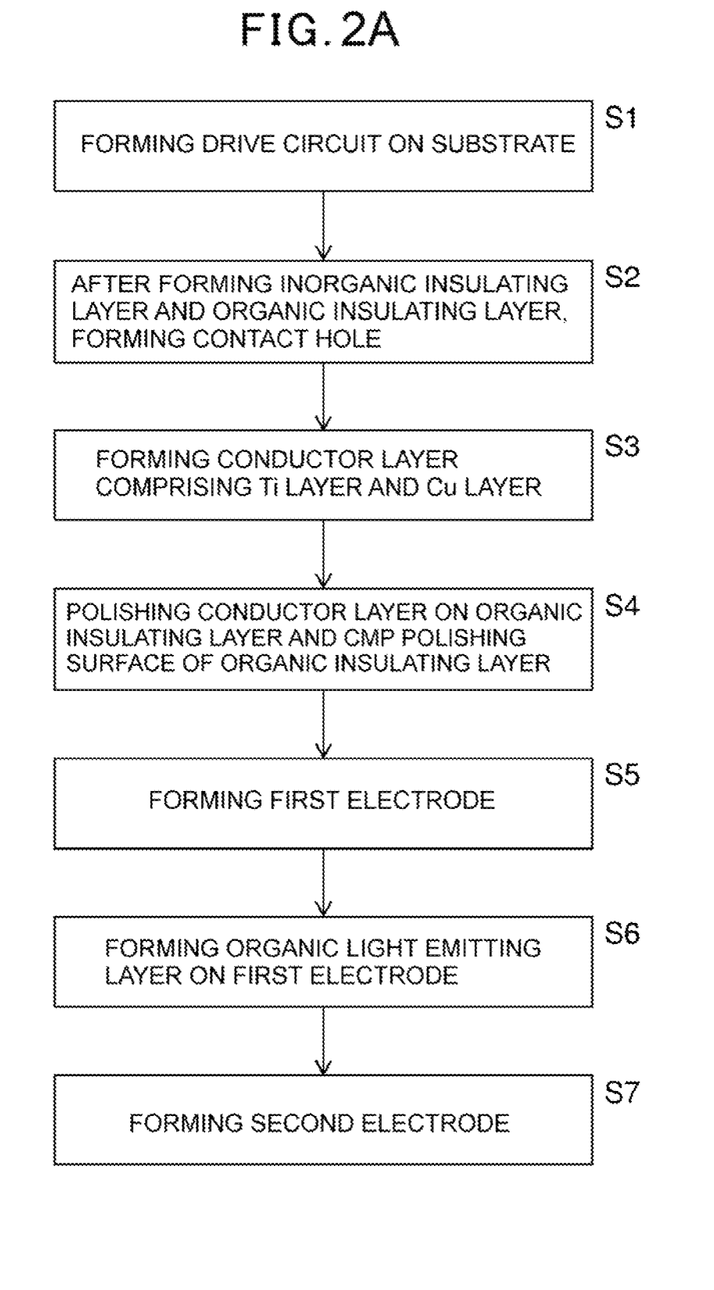
FIG. 2A shows a flowchart of manufacturing processes of the organic EL display apparatus according to Example 1 in FIG. 1.
Figure 2B:
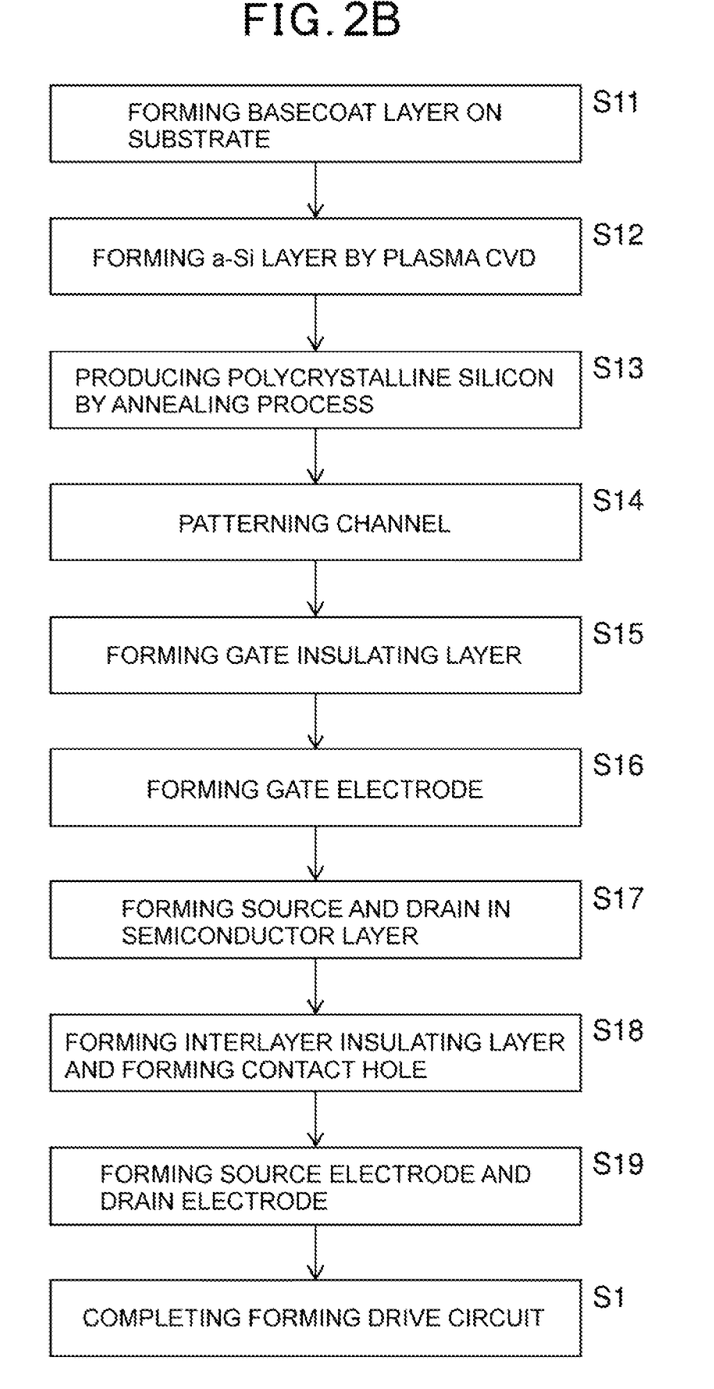
FIG. 2B shows a flowchart to describe, in further detail, the processes of FIG. 2A.
Figure 3A:
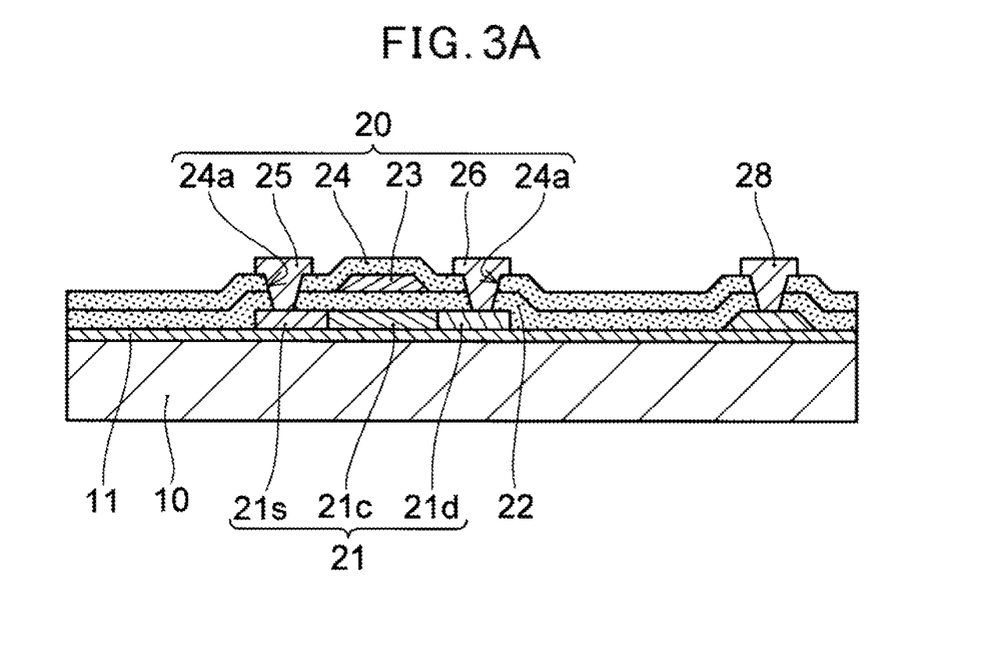
FIG. 3A shows a cross-sectional view of the manufacturing processes of the organic EL display apparatus according to Example 1 in FIG. 1.

First, as shown in FIG. 3A, a drive circuit comprising a TFT 20 is formed on a substrate 10 (S1 in FIG. 2A). More specifically, as shown with the flowchart in FIG. 2B, a basecoat layer 11 is formed on the substrate 10 (S11). The basecoat layer 11 is formed by, using plasma CVD, for example, an $SiO_2$ layer with the thickness of approximately 500 nm, and forming thereon an $SiN_x$ layer with the thickness of approximately 50 nm to deposit the lower layers, and further depositing the $SiO_2$ layer with the thickness of 250 nm as an upper layer thereof.

Thereafter, on the basecoat layer 11 is formed a semiconductor layer 21 comprising an amorphous silicon (a-Si) layer by reduced pressure plasma CVD, for example. (S12). Thereafter, an annealing process is conducted for approximately 45 minutes at approximately 450 degrees Celsius under nitrogen atmosphere, for example, to produce polycrystalline silicon (LTPS: low temperature polysilicon) (S13).

Subsequently, a resist mask is formed by a photolithography process, a semiconductor layer 21 is patterned by dry etching, and lines such as a cathode line 27 and the semiconductor layer 21 of a portion to be the TFT 20 is formed (S14). Thereafter, a gate insulating layer 22 is formed (S15). The gate insulating layer 22 is formed by depositing $SiO_2$ with the thickness of approximately 50 nm by plasma CVD.

Thereafter, using reduced pressure plasma CVD, for example, a metal layer such as molybdenum (Mo) is formed with the thickness of approximately 250 nm, and, using a photolithography process, patterned by applying dry etching after forming a resist mask to form a gate electrode 23 (S16).

Thereafter, a source 21s and a drain 21d are formed in the semiconductor layer 21. More specifically, for example, after the semiconductor layer is doped with boron ($B^+$), it is subjected to an annealing process for approximately 45 minutes at approximately 350 degrees Celsius, leading to formation of the source 21s and the drain 21d being at a low resistance (S17). As the gate electrode 23 serves as a mask, boron ions are not injected into a channel 21c, but are injected only into the source 21s and the drain 21d, so as to cause the source 21s and the drain 21d to be at a low resistance.

Thereafter, an interlayer insulating layer 24 is formed on the whole surface thereof and a contact hole 24a exposing a part of the source 21s and the drain 21d is formed (S18). Using plasma CVD, for example, the interlayer insulating layer 24 is formed with deposited layers of a lower layer comprising of mainly $SiO_2$, the lower layer having the thickness of approximately 300 nm, and an upper layer comprising of mainly $SiN_x$, the upper layer having the thickness of approximately 300 nm. The contact hole 24a is formed by forming a mask through forming of a resist layer and a photolithography process and applying wet etching.

Thereafter, a metal is formed as a layer to cause a metal to be embedded at the interior of the contact hole 24a and the metal layers of the source electrode 25 and the drain electrode 26 are formed on the surface of the interlayer insulating layer 24 (S19). The source electrode 25 and the drain electrode 26 are formed by, using sputtering, for example, depositing approximately 300 nm of Ti layer and approximately 300 nm of Al layer, and depositing thereon 100 nm of Ti. By patterning the metal layers formed on the interlayer insulating layer 24 using the photography process and wet etching in the same manner as described previously, the source electrode 25 and the drain electrode 26 respectively connected to the source 21s and the drain 21d of the semiconductor layer 21 are formed. A first contact 28 connected to the cathode line 27 is formed using entirely the same method with the same processes as forming this source electrode 25 and drain electrode 26.

Using the above-described processes, a drive circuit comprising a TFT 20 of the top gate type using a top contact type LTPS, or, in other words, a portion called a backplane is formed. However, the TFT 20 is not limited to this structure, so that it can be used with the top gate type using the bottom contact type structure, the bottom gate type using the top contact type structure, or the bottom gate type using the bottom contact type structure.

Figure 3B:
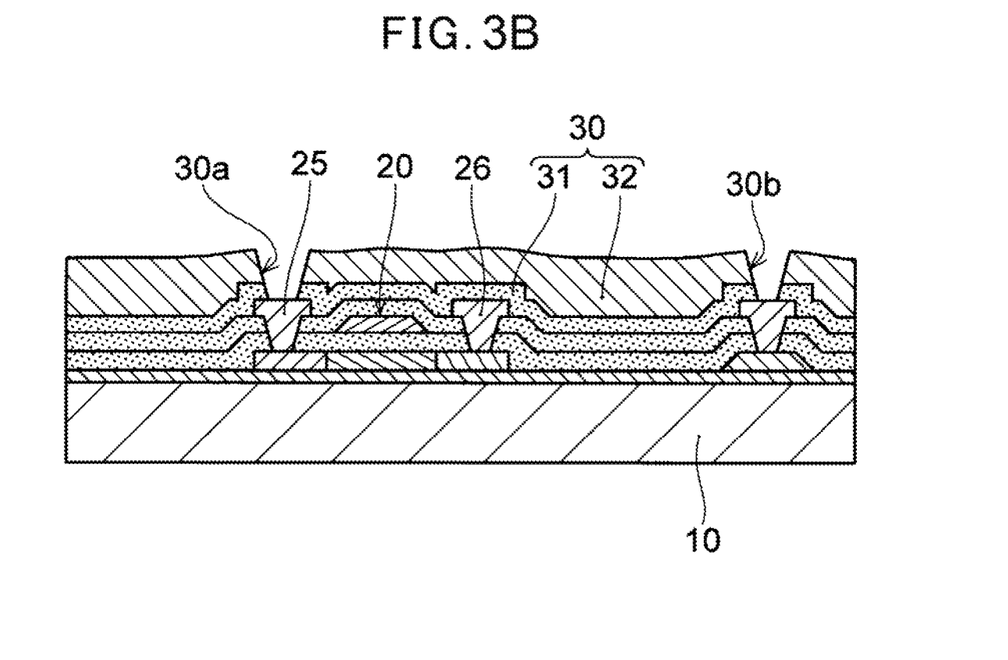
FIG. 3B shows a cross-sectional view of the manufacturing processes of the organic EL display apparatus according to Example 1 in FIG. 1.

Thereafter, as shown in FIG. 3B, after a planarizing layer 30 is formed on the surface of the drive circuit, a contact hole 30a to expose a part of the TFT is formed (S2 back in FIG. 2A). More specifically, the planarizing layer 30 comprises an inorganic insulating layer 31 and an organic insulating layer 32. The inorganic insulating layer 31 is formed with $SiN_x$ having the thickness of approximately 200 nm using plasma CVD, for example. This functions as a barrier layer to prevent components of the organic insulating layer 32 from penetrating into the TFT 20. Moreover, the organic insulating layer 32 is intended to fill up a portion of unevenness present on the surface due to the formation of the TFT 20. The surface of the organic insulating layer 32 is easily planarized by applying a liquid-like resin. While methods of applying comprise a slit coat method or a spin coat method, a slit and spin coat method combining both can be used. This organic insulating layer 32 is formed so as to have the thickness of approximately 2 μm, so that a polyimide resin or an acrylic resin can be used, for example. It can be a photosensitive resin in which a photoinitiator is mixed into these resins, an example of the resin mixed with the photoinitiator will be described below. However, a non-photosensitive resin not containing the photoinitiator is preferable since it is high in purity and, even more, the surface smoothness thereof is high. More particularly, an acrylic resin is preferable.

Thereafter, the contact hole 30a to reach the TFT 20 is formed in this planarizing layer 30. This contact hole 30a is formed using etching such as dry etching by forming a resist mask in the same manner as the previously described contact hole 24a. As with this planarizing layer 30, when a layer in which the inorganic insulating layer 31 and the organic insulating layer 32 co-exists is etched as a whole, the etching rates of these insulating layers differ, so that, in particular, etching using dry etching is preferably applied since a stepped portion is difficult to be created at the interface of these insulating layers. When the stepped portion is created, there is a problem that a metal to be embedded at the interior of the contact hole 30a is not completely embedded, causing a likelihood of contact resistance with the source electrode 25 to increase. However, with only a Ti layer 411 being a thin layer in the present embodiment, it is sufficiently embedded by electroplating even when there is the stepped portion. At this time, a contact hole 30b to form a second contact 45 connecting to the cathode line 27 is also formed in the same manner.

Figure 3C:
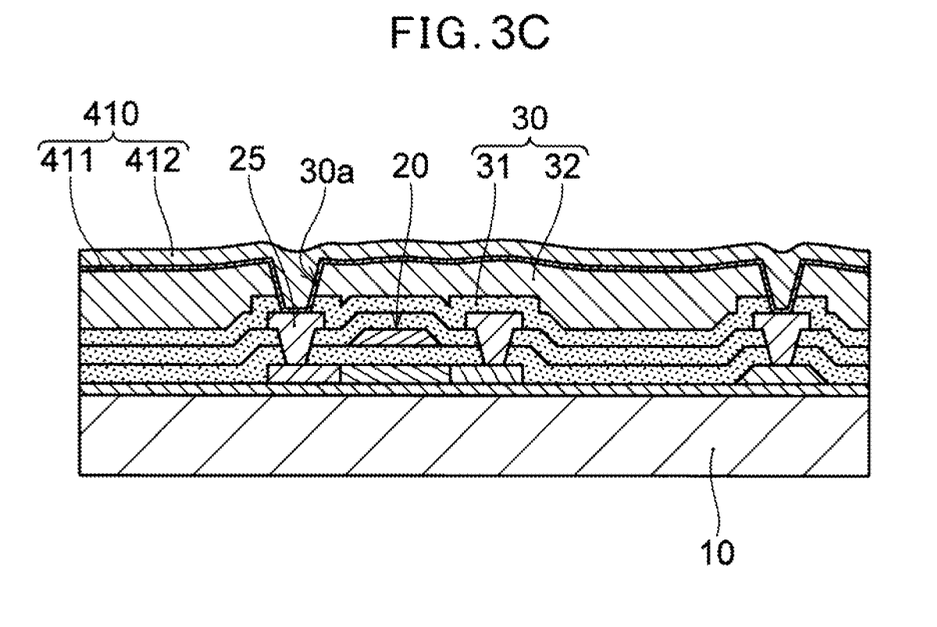
FIG. 3C shows a cross-sectional view of the manufacturing processes of the organic EL display apparatus according to Example 1 in FIG. 1.

Subsequently, as shown in FIG. 3C, a conductor layer 410 comprising the Ti layer 411 and a Cu layer 412 is formed on the inner surface of the contact hole 30a and the surface of the organic insulating layer 32 (S3). More specifically, using sputtering or the like, the titanium layer 411 is formed with the previously-described thickness and, thereafter, the copper layer 412 is formed using electroplating with the titanium layer 411 as a current supplying layer (a seed layer).

Figure 3D:
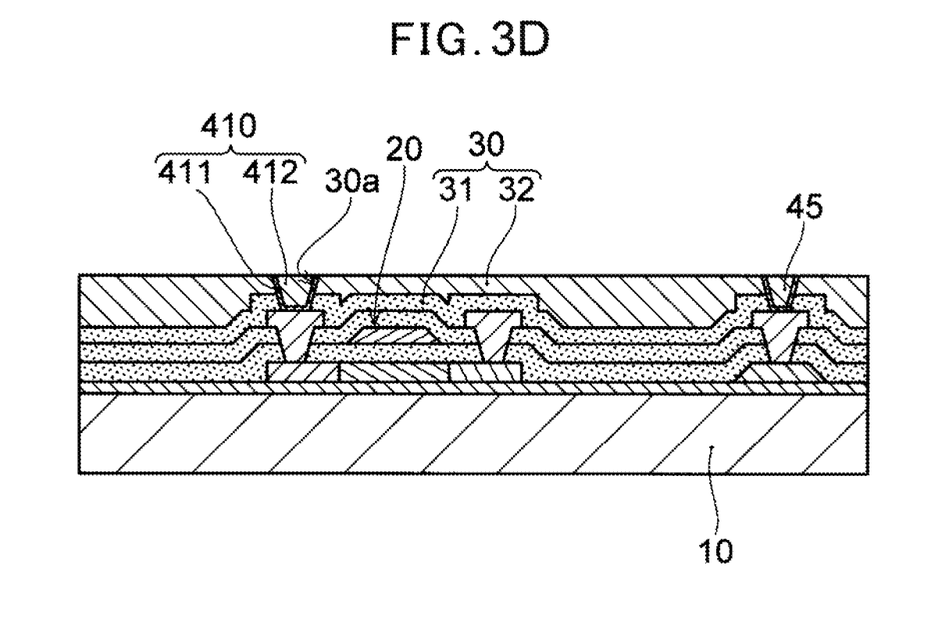
FIG. 3D shows a cross-sectional view of the manufacturing processes of the organic EL display apparatus according to Example 1 in FIG. 1.

Thereafter, as shown in FIG. 3D, the conductor layer 410 formed on the surface of the organic insulating layer 32 is removed by polishment and, moreover, the surface of the organic insulating layer 32 is planarized by CMP (S4). Cu is chemically stable, so that it is difficult to apply etching thereto. Therefore, the conductor layer 410 formed on the surface of the organic insulating layer 32 is removed by chemical mechanical polishing. As a result, the surface of the conductor layer 410 embedded at the interior of the contact hole 30a is almost in the same plane with the surface of the organic insulating layer 32, and the surface of the organic insulating layer 32 is planarized even when viewed microscopically.

Polishing of this conductor layer 410 is conducted using a slurry comprising fine particles of cerium oxide ($CeO_2$), silica ($SiO_2$), or to alumina ($Al_2O_3$) and the conductor layer 410 formed on the organic insulating layer 32 is removed. Moreover, the surface of the organic insulating layer 32 is also CMP polished by supplying a ceria-based slurry being neutral, or a fumed silica-based slurry with water and alcohol so as to be a planar surface having a surface roughness of no more than 50 nm in arithmetic average roughness Ra. At this time, the second contact 45 to connect the cathode (second electrode) of the organic EL display apparatus to the cathode line 27 is also similarly formed of the Ti layer 411 and the Cu layer 412.

In other words, a liquid-like resin is applied onto the organic insulating layer 32 using a slit and spin coat method and dried, the surface thereof is easily planarized and, as described previously, this surface is formed with arithmetic average roughness Ra of approximately 100 to 300 nm. However, as described previously, the present inventor has found that chromaticity unevenness and/or luminance unevenness occurs with the planarity of only applying and hardening of this organic insulating layer 32 and that the light emitting characteristics is possibly not sufficiently satisfactory. Therefore, using CMP, the planarity of the surface thereof is polished so as to have arithmetic average roughness Ra of no more than 50 nm. While this planarity is preferably small, an extreme planarity of not more than 20 nm as disclosed in Patent document 1 is not required. With no more than approximately 50 nm of planarity, chromaticity unevenness and/or luminance unevenness did not occur to an extent that it is problematic. While the Cu layer 412 is chemically stable as described previously, so that chemical mechanical polishing is preferably applied thereto, the organic insulating layer 32 is preferably polished by CMP using the slurry described above.

Figure 3E:
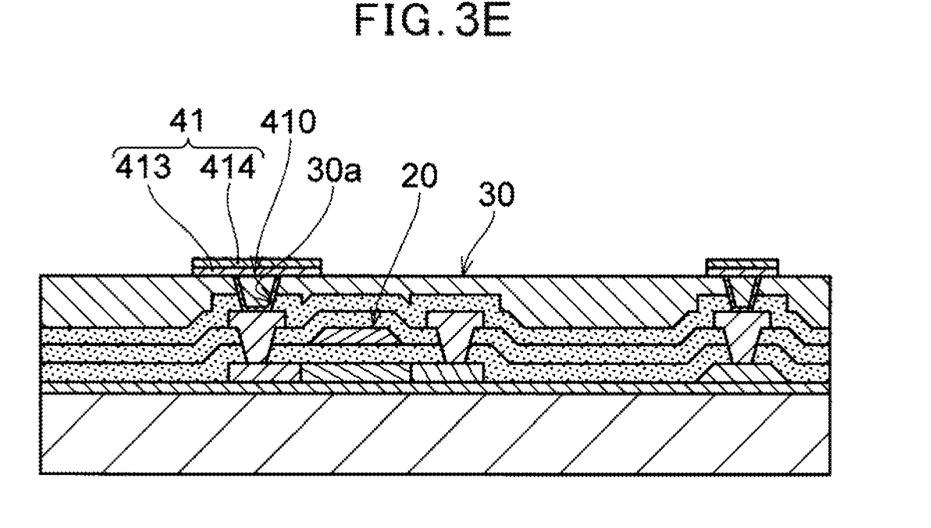
FIG. 3E shows a cross-sectional view of the manufacturing processes of the organic EL display apparatus according to Example 1 in FIG. 1.

Thereafter, as shown in FIG. 3E, a first electrode 41 of an organic light emitting element 40 (see FIG. 3F) is formed on the surface planarizing layer 30 so as to be connected to the conductor layer 410 formed at the interior of the contact hole 30a (S5). More specifically, using sputtering, for example, a lower layer in which an Ag layer or an APC layer having a thickness of approximately 100 nm is deposited and an upper layer comprising an ITO layer having a thickness of approximately 10 nm is formed. As a result, the Ag layer or the APC layer being in close contact with the conductor layer 410 at the interior of the contact hole 30a is formed and, moreover, the ITO layer is formed on the surface thereof, so that the first electrode being well-adapted also to the organic light emitting layer 43 formed thereon is formed.

Figure 3F:
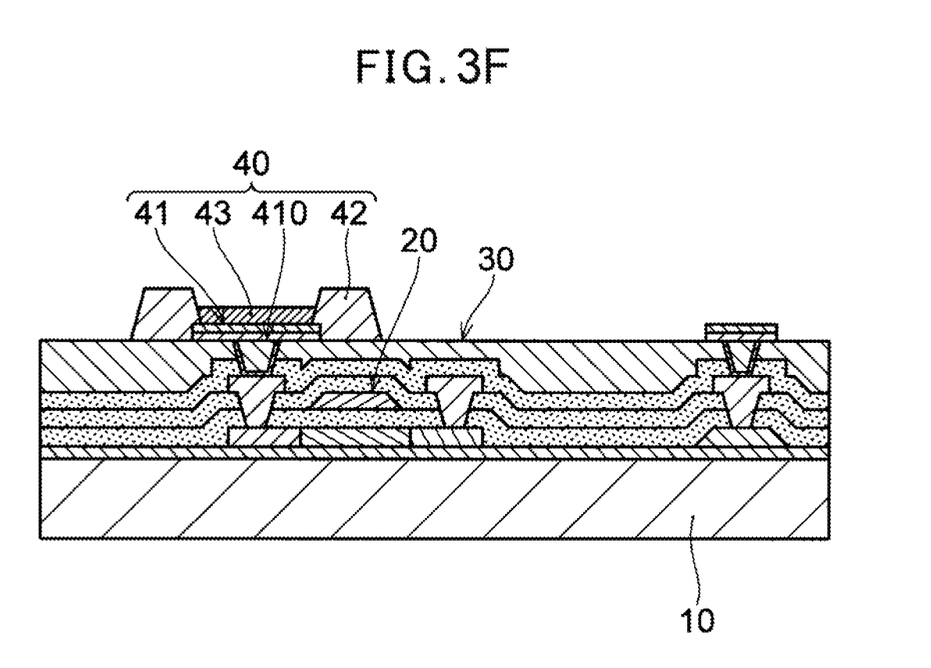
FIG. 3F shows a cross-sectional view of the manufacturing processes of the organic EL display apparatus according to Example 1 in FIG. 1.

Thereafter, as shown in FIG. 3F, the organic light emitting layer 43 is formed on the first electrode 41 (S6). More specifically, an insulating bank 42 is formed to partition each pixel at the peripheral edge of the first electrode 41 and to prevent the cathode and the anode from being in contact. The insulating bank 42 can be an inorganic insulating layer such as $SiO_2$, or an organic insulating layer such as a polyimide or acrylic resin. It is formed so as to be formed on the entire surface and so that a given location of the first electrode 41 is exposed. The insulating bank 42 is formed with the height of approximately 1 μm. As described previously, with the organic light emitting layer 43 in which various organic materials are deposited, the organic materials are deposited using vacuum deposition, for example, in which case it is formed via a deposition mask in which a desired to sub-pixel such as R, G, or B is opened through an opening of the deposition mask. On the surface of the organic light emitting layer 43 can be formed a layer such as LiF to improve the electron injectability. It can also be formed by printing such as an inkjet method, not by vapor deposition. Ag is used in the first electrode 41 for the reason that light emitted by the organic light emitting layer 43 is reflected for use as the top emission type.

Figure 3G:
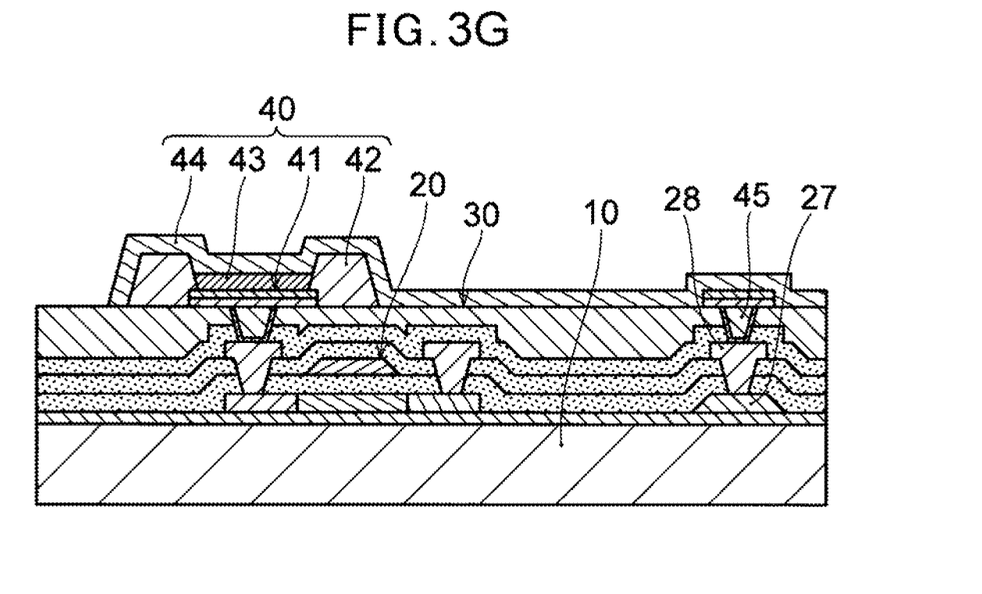
FIG. 3G shows a cross-sectional view of the manufacturing processes of the organic EL display apparatus according to Example 1 in FIG. 1.

Thereafter, as shown in FIG. 3G, a second electrode (cathode) 44 is formed on the organic light emitting layer 43 (S7). The second electrode 44 is made to be a cathode by forming and patterning a thin film Mg—Ag eutectic layer on the whole surface using deposition. This second electrode 44 is also formed on the second contact 45 so as to be connected to the cathode line 27 via the second contact 45 and the first contact 28. With Mg and Ag, having different melting points, being evaporated from separate crucibles, this Mg—Ag eutectic layer is eutecticized at the timing of forming thereof. It is formed with the thickness of approximately from 10 nm to 20 nm with approximately 90 mass % of Mg and approximately 10 mass % of Ag.

An encapsulation layer 46 to protect the second electrode 44 and the organic light emitting layer 43 from moisture or oxygen is formed on this second electrode 44. This encapsulation layer 46 is to protect the second electrode 44 and the organic light emitting layer 43 being susceptible to moisture or oxygen, so that an inorganic insulating layer such as $SiO_2$ or $SiN_x$ is formed using plasma CVD or the like. This encapsulation layer 46 is preferably formed such that an end portion thereof is in close contact with an inorganic layer such as the first inorganic insulating layer 31 or the like. The reason is that, while there is good contactability for bonding between inorganic layers, it is difficult to obtain good bonding with complete contactability for bonding with an organic layer. Therefore, it is preferable to remove a part of the organic insulating layer 32 and the encapsulation layer 46 bonds with the first inorganic insulating layer 31 being a layer lower to the organic insulating layer 32. In this way, penetration of moisture can be prevented completely.

Example 2

In the method of manufacturing according to Example 1 as shown in FIGS. 2A to 2B and FIGS. 3A to 3G, with the planarizing layer 30, the inorganic insulating layer 31 and the organic insulating layer 32 are continuously formed and the contact holes 30a are formed in a collective manner. However, it can be made such that the organic insulating layer 32 being photosensitive is formed as the organic insulating layer 32, the first contact hole 30a1 is formed after the inorganic insulating layer 31 is formed, after which the organic insulating layer 32 being photosensitive is formed, the second contact hole 30a2 is formed by exposure and development, resulting in contact holes 30a, an example of which is shown FIGS. 4A and 4B.

Figure 4A:
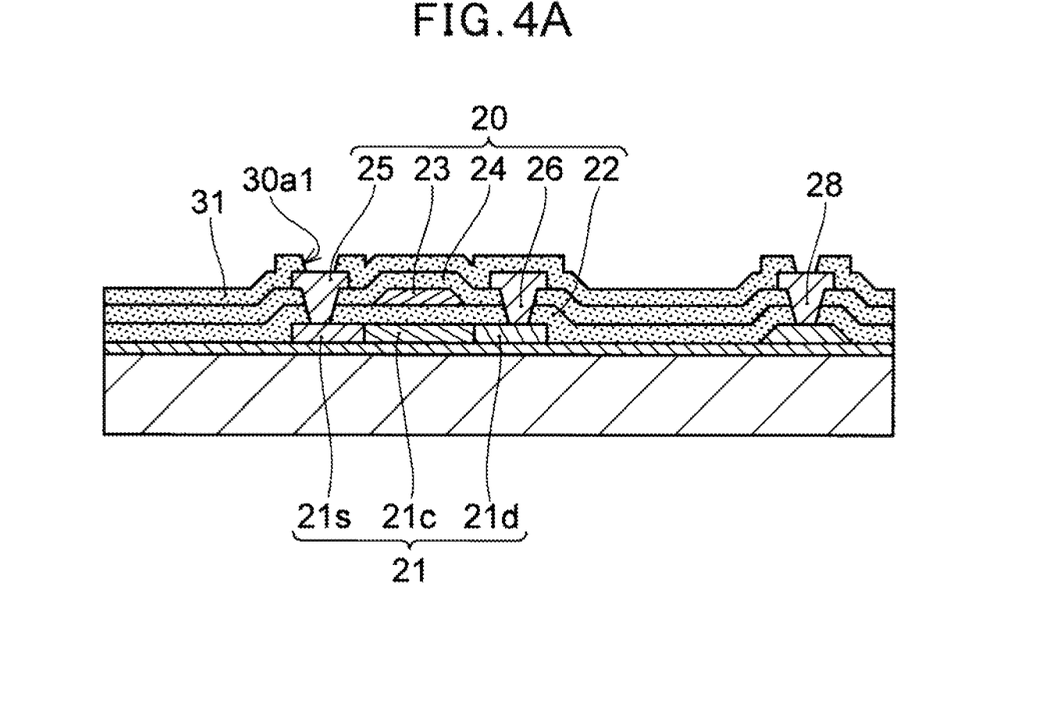
FIG. 4A shows a cross-sectional view of the manufacturing processes of the organic EL display apparatus according to Example 2 in FIG. 1.

More specifically, the previously described processes shown in FIG. 3A are performed in the same manner as in Example 1. Thereafter, as shown in FIG. 4A, after the inorganic insulating layer 31 is formed, the first contact hole 30a1 is formed at a location at which the contact hole 30a is formed. In the same manner as forming of the contact hole 30a as previously described, after a resist layer is formed, an opening is formed in the resist layer using a photography process, and, with the resist layer as a mask, etching is applied using dry etching. When the photosensitive organic insulating layer is formed, forming of the second contact hole 30a2 is easy, but the effect of leveling of the organic insulating layer decreases due to addition of the photoinitiator, so that the surface roughness increases. However, that surface is CMP polished, so that no problem occurs.

Figure 4B:
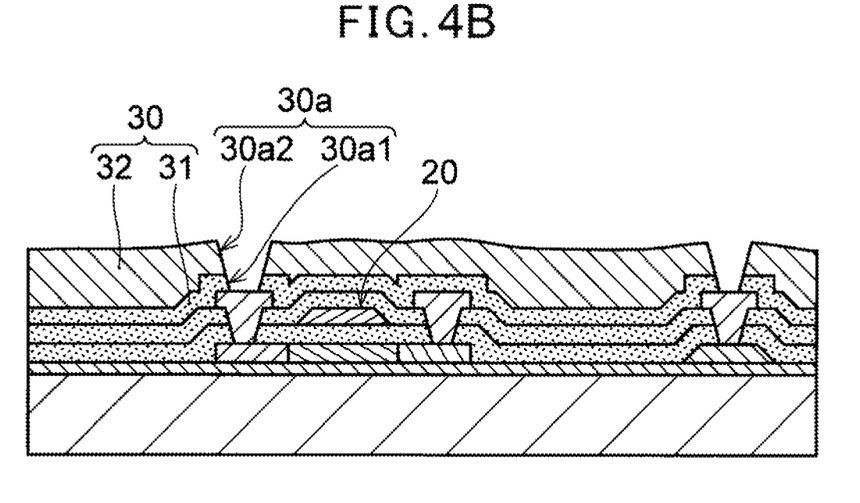
FIG. 4B shows a cross-sectional view of the manufacturing processes of the organic EL display apparatus according to Example 2 in FIG. 1.

Thereafter, as shown in FIG. 4B, the organic insulating layer 32 is formed and the second contact hole 30a2 is formed using exposure and development at the position of the first contact hole 30a1 of the inorganic insulating layer 31. As a result, the second contact hole 30a2 continues to the first contact hole 30a1 to result in the contact hole 30a. As a result, the structure will be the same as the structure shown in FIG. 3B, and subsequent processes will be the same as in Example 1. Therefore, the explanations thereof will be omitted.

CONCLUSION (1) An organic EL display apparatus according to one Embodiment of the present invention comprises a substrate having a surface on which a drive circuit comprising a thin film transistor is formed; a planarizing layer to cover the drive circuit to planarize the surface of the substrate; and an organic light emitting element having a first electrode, the first electrode being formed on the surface of the planarizing layer and connected to the drive circuit, an organic light emitting layer, the organic light emitting layer being formed on the first electrode, and a second electrode, the second electrode being formed on the organic light emitting layer, wherein the planarizing layer comprises a two-layer structure comprising an inorganic insulating layer and an organic insulating layer, wherein a conductor layer comprising a titanium layer and a copper layer is embedded at an interior of a contact hole, and the first electrode is formed so as to electrically connect to the conductor layer.

According to the present Embodiment, the interior of the contact hole is filled with an electroplating layer of copper having a very small electric resistance, so that the interior of the contact hole is sufficiently filled up with copper and connected to the thin film transistor at a low resistance. Moreover, the portion of the first electrode of the organic light emitting element, being in contact with the conductor layer at the interior of the contact hole is Ag or APC, so that it is made to be connected without generally causing electrical resistance. Moreover, rather than forming the first electrode of the organic light emitting element on the surface of the planarizing layer being formed with the organic insulating layer as it is, the surface of the organic insulating layer is polished, so that, even in the microscopically planar state, there is no unevenness and the normal direction of the surface of the organic light emitting layer of a small sub-pixel almost matches the normal direction of the display screen. As a result, the problem of light of some of small sub-pixels travelling in an oblique direction is eliminated, and factors decreasing the display definition such as luminance unevenness or chromaticity unevenness are eliminated. As a result, an organic EL display apparatus having a very good display definition can be obtained.

(2) The organic insulating layer being a photosensitive resin is preferable in making it easier to form the contact hole.

(3) The surface of the planarizing layer being formed with no more than 50 nm in arithmetic average roughness Ra by polishing is preferable in making it possible to prevent chromaticity unevenness and/or luminance unevenness.

(4) By the surface of the conductor layer being embedded within the contact hole being formed with no more than 50 nm in arithmetic average roughness Ra by polishing, a planar organic light emitting layer is obtained even when the first electrode of the organic light emitting element is formed immediately on this contact hole.

(5) The first electrode comprising Ag or APC and ITO is preferable in that it is adapted to Cu and Ag or APC, and, moreover, the positive hole injectability of the ITO and organic light emitting layer improves.

(6) The first electrode being formed on the conductor layer being embedded within the contact hole makes it possible to reduce the dedicated area for each pixel, realize higher definition, and shorten the distance between the TFT and the first electrode, causing electric resistance to be reduced and electrical characteristics to improve.

(7) Ag or APC of the first electrode being connected to the titanium layer or the copper layer, the titanium layer or the copper layer being embedded at the interior of the contact hole, and the ITO layer being formed at an interface with the organic light emitting layer is preferable in having good mutual compatibility with layers being in contact respectively.

(8) A method of manufacturing an organic EL display apparatus according to another Embodiment of the present invention comprises forming, on a substrate, a drive circuit comprising a thin film transistor; after forming, on a surface of the drive circuit, a planarizing layer comprising an inorganic insulating layer and an organic insulating layer, forming, at the planarizing layer, a contact hole exposing a part of the thin film transistor; forming, on an inner surface of the contact hole and a surface of the organic insulating layer, a conductor layer comprising a titanium layer and a copper layer; removing the conductor layer from the surface of the organic insulating layer by polishment, and then planarizing the surface, exposed by removing the conductor layer, of the organic insulating layer by chemical mechanical polishing (CMP); forming, on a surface polished by CMP of the organic insulating layer, a first electrode so as to be connected to the conductor layer formed at an interior of the contact hole; forming an organic light emitting layer on the first electrode; and forming a second electrode on the organic light emitting layer.

According to the present embodiment, the conductor layer is formed by electroplating after forming the Ti layer at the interior of the contact hole, so that a metal is sufficiently embedded at the interior of the contact hole and the surface thereof is made in the same plane with the organic insulating layer by polishing. Therefore, even when the first electrode is formed on the surface thereof, the surface of the first electrode becomes planar. As a result, the surface of the organic light emitting layer formed thereon also becomes planar, making it difficult for chromaticity unevenness and luminance unevenness to occur.

(9) In the forming of the first electrode, after forming an Ag layer or an APC layer, forming an ITO layer, and then patterning the Ag layer or the APC layer, and the ITO layer is preferable in that ITO being to preferable in terms of work function is formed on a surface being in contact with the organic light emitting layer.

(10) Conducting the polishing using a slurry comprising fine particles of cerium oxide ($CeO_2$), silica ($SiO_2$), or alumina ($Al_2O_3$) is preferable in that a surface having a small surface roughness can be obtained in a short time.

DESCRIPTION OF REFERENCE NUMERALS

10 Substrate
20 TFT
21 Semiconductor layer
30 Planarizing layer
31 Inorganic insulating layer
32 Organic insulating layer
33 Second inorganic insulating layer
40 Organic light emitting element
41 First electrode (anode)
410 Conductor layer
411 Ti layer
412 Cu layer
413 Ag or APC layer
414 ITO layer
43 Organic light emitting layer
44 Second electrode (cathode)

The invention claimed is:

1. An organic EL display apparatus comprising:
a substrate having a surface on which a drive circuit comprising a thin film transistor is formed;
a planarizing layer to cover the drive circuit to planarize the surface of the substrate; and
an organic light emitting element having a first electrode, the first electrode being formed on a surface of the planarizing layer and connected to the drive circuit, an organic light emitting layer, the organic light emitting layer being formed on the first electrode, and a second electrode, the second electrode being formed on the organic light emitting layer,
wherein the planarizing layer comprises a two-layer structure comprising an inorganic insulating layer and an organic insulating layer, the inorganic insulating layer and the organic insulating layer being deposited on the thin film transistor, and
wherein a connection between the drive circuit and the first electrode is made via a conductor layer being embedded at an interior of a contact hole formed at the planarizing layer, the conductor layer comprising a titanium layer and a copper layer, and the first electrode is formed so as to electrically connect to the conductor layer, and
wherein a surface of the conductor layer and the surface of the planarizing layer are formed on the same plane with 20 nm or more and 50 nm or less in arithmetic average roughness Ra by polishing, and the first electrode and the organic light emitting layer each having an almost same surface roughness as that of the surface of the planarizing layer are formed, thereby a surface of the organic light emitting layer is formed with no inclined surface due to unevenness of a light emitting surface even when viewed microscopically.

2. The organic EL display apparatus according to claim 1, wherein the organic insulating layer is a photosensitive resin.

3. The organic EL display apparatus according to claim 1, wherein the first electrode comprises an Ag layer or an APC layer, and an ITO layer.

4. The organic EL display apparatus according to claim 1, wherein the first electrode is formed on the conductor layer being embedded within the contact hole.

5. The organic EL display apparatus according to claim 3, wherein the Ag layer or the APC layer of the first electrode is connected to the titanium layer or the copper layer, the titanium layer or the copper layer being embedded at the interior of the contact hole, and the ITO layer is formed at an interface with the organic light emitting layer.

6. A method of manufacturing an organic EL display apparatus, the method comprising:
forming, on a substrate, a drive circuit comprising a thin film transistor;
forming, on a surface of the drive circuit, a planarizing layer comprising an inorganic insulating layer and an organic insulating layer, and then forming, at the planarizing layer, a contact hole exposing a part of the thin film transistor;
forming, on an inner surface of the contact hole and a surface of the organic insulating layer, a conductor layer comprising a titanium layer and a copper layer:
removing the conductor layer from the surface of the organic insulating layer by polishment, and then planarizing a surface of the conductor layer inside the contact hole and the surface, exposed by removing the conductor layer, of the organic insulating layer by chemical mechanical polishing (CMP), thereby the surface of the conductor layer and a surface of the planarizing layer are substantially formed in a same plane with 20 nm or more and 50 nm or less in arithmetic average roughness Ra;
forming, on a surface polished by CMP of the organic insulating layer, a first electrode to be connected to the conductor layer formed at an interior of the contact hole, the first electrode having substantially a same surface roughness as that of the planarizing layer;
forming an organic light emitting layer on the first electrode, so that a surface of the organic light emitting layer has substantially a same roughness as that of the first electrode, without inclined surface due to unevenness of a light emitting surface even when viewed microscopically; and
forming a second electrode on the organic light emitting layer.

7. The method of manufacturing an organic EL display apparatus according to claim 6, the method further comprising,
   in the forming of the first electrode, after forming an Ag layer or an APC layer, forming an ITO layer, and then patterning the Ag layer or the APC layer, and the ITO layer.

8. The method of manufacturing an organic EL display apparatus according to claim 6, wherein the CMP is conducted by using a slurry comprising fine particles of cerium oxide ($CeO_2$), silica ($SiO_2$), or alumina ($Al_2O_3$).

* * * * *